US012733266B2

(12) United States Patent
Subramani et al.

(10) Patent No.: US 12,733,266 B2
(45) Date of Patent: Sep. 8, 2026

(54) SOLAR MODULE

(71) Applicant: REC Solar PTE. Ltd., Singapore (SG)

(72) Inventors: Thiyagu Subramani, Singapore (SG); Shankar Gauri Sridhara, Singapore (SG)

(73) Assignee: REC Solar PTE. Ltd., Singapore (SG)

( * ) Notice: Subject to any disclaimer, the term of this patent is extended or adjusted under 35 U.S.C. 154(b) by 0 days.

(21) Appl. No.: 18/724,995

(22) PCT Filed: Dec. 9, 2022

(86) PCT No.: PCT/EP2022/085146

§ 371 (c)(1),
(2) Date: Jun. 27, 2024

(87) PCT Pub. No.: WO2023/126145

PCT Pub. Date: Jul. 6, 2023

(65) Prior Publication Data

US 2025/0072123 A1 Feb. 27, 2025

(30) Foreign Application Priority Data

Dec. 29, 2021 (GB) ..................................... 2119059

(51) Int. Cl.

| | |
|---|---|
| ***H10F 19/90*** | (2025.01) |
| ***H10F 19/70*** | (2025.01) |
| ***H10F 77/00*** | (2025.01) |

(52) U.S. Cl.

CPC ........... *H10F 19/904* (2025.01); *H10F 19/70* (2025.01); *H10F 77/937* (2025.01)

(58) Field of Classification Search

CPC ....... H10F 19/904; H10F 19/70; H10F 77/937
See application file for complete search history.

(56) References Cited

U.S. PATENT DOCUMENTS

| | | | | |
|---|---|---|---|---|
| 9,780,253 B2 | 10/2017 | Morad et al. | | |
| 2007/0227580 A1* | 10/2007 | Nakajima | .............. | H10F 19/90 136/244 |

(Continued)

FOREIGN PATENT DOCUMENTS

| | | |
|---|---|---|
| CN | 105990470 A | 10/2016 |
| CN | 209435183 U | 9/2019 |

(Continued)

OTHER PUBLICATIONS

GB Search Report GB Application No. GB2119059.0, mailed Jun. 1, 2022, 4 pages.

(Continued)

*Primary Examiner* — Sadie White
(74) *Attorney, Agent, or Firm* — Lee & Hayes, P.C.

(57) ABSTRACT

A solar module comprising a plurality of solar cell strings arranged side-by-side, each solar cell string having positive and negative terminals at opposite ends thereof, the plurality of solar cell strings comprising: a first group of adjacent solar cell strings, each oriented such that their positive terminals are disposed towards a first end of the solar module; and a second group of adjacent solar cell strings, each oriented such that their positive terminals are disposed towards a second end of the solar module opposite the first end, the positive terminals of the second group of solar cell strings electrically connected to the negative terminals of the first group of solar cell strings.

15 Claims, 2 Drawing Sheets

(56) References Cited

U.S. PATENT DOCUMENTS

| | | | | |
|---|---|---|---|---|
| 2012/0285512 | A1* | 11/2012 | Philipp | H10F 19/31 257/E31.124 |
| 2013/0192657 | A1* | 8/2013 | Hadar | H10F 77/955 136/244 |
| 2014/0130842 | A1* | 5/2014 | Castillo-Aguilella | H10F 19/902 136/246 |
| 2015/0090314 | A1 | 4/2015 | Yang et al. | |
| 2015/0349170 | A1 | 12/2015 | Morad et al. | |
| 2015/0349176 | A1* | 12/2015 | Morad | H10F 19/00 136/251 |
| 2015/0349703 | A1 | 12/2015 | Morad et al. | |
| 2020/0313017 | A1* | 10/2020 | Nanba | H10F 19/902 |
| 2021/0126153 | A1* | 4/2021 | Zhou | H10F 19/902 |

FOREIGN PATENT DOCUMENTS

| | | | |
|---|---|---|---|
| CN | 210167367 | U | 3/2020 |
| CN | 210296399 | U | 4/2020 |
| CN | 111200036 | A | 5/2020 |
| EP | 1840976 | A1 | 10/2007 |

OTHER PUBLICATIONS

Search Report and Written Opinion for International Application No. PCT/EP2022/085146, mailed Apr. 6, 2023, 10 pages.

Voz, et al., "Microdoping Compensation of Microcrystalline Silicon Obtained by Hot-Wire Chemical Vapour Deposition," Solar Energy Materials & Solar Cells, vol. 63, 2000, pp. 237-246.

* cited by examiner

SOLAR MODULE

CROSS-REFERENCE TO RELATED APPLICATIONS

This application is a U.S. National Phase Patent Application based on International Patent Application No. PCT/EP2022/085146, filed Dec. 9, 2022; which claims priority to GB Patent Application No. 2119059.0, filed Dec. 29, 2021. The above referenced applications are incorporated herein by reference in their entirety as if fully set forth herein.

FIELD OF THE DISCLOSURE

The present disclosure relates to solar modules and particularly, but not exclusively, to solar modules of the type comprising a plurality of solar cell strings arranged side-by-side.

BACKGROUND

Solar modules for providing electrical energy from sunlight comprise an array of photovoltaic cells (also referred to herein as solar cells), each comprising a semiconductor substrate. The cells are traditionally connected so that electrical current is routed via a grid of finger electrodes on the cell surfaces to a series of wider, perpendicular busbar electrodes which are printed on the front and backside of the cells. From the busbar electrodes, the electrical current flows to a junction box along a series of copper ribbons, each one soldered to a respective busbar electrode. In some arrangements the busbars are replaced by a series of copper ribbons/wires arranged on the grid of fingers.

In particular, a plurality of solar cells may be electrically connected in series and in a row so as to define a solar cell string. A solar module may comprise a plurality of such strings arranged side-by-side so as to form rows of solar cells. The solar cell strings may be electrically connected to one another, and to the junction box, by bus bars connected at the ends of the solar cell strings.

SUMMARY

According to a first aspect there is provided a solar module comprising a plurality of solar cell strings arranged side-by-side, each solar cell string having positive and negative terminals at opposite ends thereof, the plurality of solar cell strings comprising:

- a first group of adjacent solar cell strings, each oriented such that their positive terminals are disposed towards a first end of the solar module; and
- a second group of adjacent solar cell strings, each oriented such that their positive terminals are disposed towards a second end of the solar module opposite the first end, the positive terminals of the second group of solar cell strings electrically connected to the negative terminals of the first group of solar cell strings.

Bus bars can represent a short circuit risk where they overlap, and so must be insulated from one another, which increases the complexity of manufacturing and assembling the solar module. The disclosed arrangement may allow the solar cell strings to be connected to one another, and to an external circuit or external components, without the need to overlap bus bars providing those connections. This may avoid the need to provide electrical insulation between the bus bars and/or may reduce the possibility of short circuits occurring.

The term "end" is not intended to be restricted to a longitudinal end of a solar module (i.e. represented by a short side of a rectangular solar module). That is, the "ends" could be any opposite regions of the solar module including, e.g. opposite longer sides of a rectangular solar module.

For the avoidance of doubt, the term "adjacent", as used herein, means two solar cell strings next to one another, without any solar cell strings positioned therebetween. Two adjacent solar cell strings may be in contact with one another (i.e. directly adjacent) or may be spaced from one another.

It should also be understood that the term 'connected', as used herein, is intended to mean electrically connected, and does not require direct (e.g. physical) contact between the connected components (i.e. this term does not require the negative terminals of the first group to be in direct contact with the positive terminals of the second group). For example, two terminals may be physically spaced apart and one or more wires (or other conductive elements) may be connected to both two terminals in order to electrically connect the terminals together.

Optional features will now be set out. These are applicable singly or in any combination with any aspect.

Each solar cell string of the first group may be connected in series with at least one solar cell string of the second group.

Each solar cell string of the first group may be connected in parallel with the other solar cell strings of the first group. Each solar cell string of the second group may be connected in parallel with the other solar cell strings of the second group. The first group of solar cell strings may be connected in series with the second group of solar cell strings.

Each solar cell string may be connected in series with only one other solar cell string to define a solar cell string pair, and each solar cell string pair may comprise a solar cell string of the first group and a solar cell string of the second group. Each solar cell string pair may be connected in parallel with the other solar cell string pairs.

The solar module may comprise one or more intermediate conductive elements electrically connecting the positive terminals of the solar strings of the second group to the negative terminals of the solar cell strings of the first group. Each intermediate conductive element may be attached to, or may be integral with, the solar cell strings it connects. The one or more intermediate conductive elements may be integral with bus bars of the solar cell strings. At least one (e.g. each) intermediate conductive element may be in the form of an interconnection bus bar. At least one (e.g. each) intermediate conductive element may be in the form of a wire.

The at least one intermediate conductive element (e.g. interconnection bus bar) may comprise a core surrounded by an outer layer. The core may comprise copper (e.g. may be copper plate). The outer layer may comprise a soldering alloy (i.e. having a melting point suitable for soldering).

The solar module may comprise a single (i.e. only one) intermediate conductive element connecting each positive terminal of the second group of solar cell strings to each negative terminal of the first group of solar cell strings. That is, the single intermediate conductive element may connect all of the solar cell strings of the first group to all of the solar cell strings of the second group. In such an embodiment, the intermediate conductive element may comprise a plurality of legs, each connected to a corresponding solar cell string, and a crosslink connecting the plurality of legs. Each leg may be substantially parallel with the elongate axes of the solar cell strings. The crosslink may be substantially perpendicular to the legs.

The solar module may comprise a plurality of intermediate conductive elements. Each of the plurality of intermediate conductive elements may connect the positive terminal of the solar cell string of the second group in a solar cell string pair to the negative terminal of the solar cell string of the first group in the solar cell string pair. In other word, each intermediate conductive element may connect (only) two solar cell strings; one from the first group (via its negative terminal) and one from the second group (via its positive terminal).

Each intermediate conductive element may comprise a first leg connected to the negative terminal of the solar cell string of the first group, a second leg connected to the positive terminal of the solar cell string of the second group, and a crosslink connecting the first and second legs. The first and second legs may be substantially parallel to the elongate axes of the solar cell strings. The crosslink may be substantially perpendicular to the first and second legs. In this respect, each intermediate conductive element may be U-shaped.

The intermediate conductive elements (e.g. U-shaped intermediate conductive elements) may be arranged concentrically. Each group of solar cell strings may comprise a first solar cell string that is closest to the other group of solar cell strings (i.e. may be the innermost solar cell string). Each group of solar cell strings may comprise a second solar cell string that is spaced outwardly (i.e. in a direction away from the other group of solar cell strings) from the first solar cell string. A second intermediate conductive element connecting the second solar cell strings of the first and second groups may extend around a first (innermost) intermediate conductive element connecting the first solar cell strings. Accordingly, the legs and crosslink of the second intermediate conductive element may be longer than the legs and the crosslink of the first intermediate conductive element.

Each group of solar cell strings may comprise a third solar cell string that is spaced outwardly of the second solar cell string. A third intermediate conductive element may connect the third solar cell strings of the first and second groups. The third intermediate conductive element may extend around the second intermediate conductive element. Accordingly, the legs and crosslink of the third intermediate conductive element may be longer than the legs and the crosslink of the second intermediate conductive element.

The solar module may comprise one or more first conductive elements for connection to the positive terminals of the first group of solar cell strings. The solar module may comprise a single first conductive element for connection to the positive terminals of the first group of solar cells. The first conductive element may comprise a plurality of legs connected to the positive terminals of the solar cell strings and a crosslink connecting the plurality of legs.

The solar module may comprise one or more second conductive elements for connection to the negative terminals of the second group of solar cell strings. The solar module may comprise a single second conductive element for connection to the negative terminals of the second group of solar cells. The second conductive element may comprise a plurality of legs connected to the negative terminals of the solar cell strings and a crosslink connecting the plurality of legs.

A bypass diode (e.g. a power management device) may be connected between the first and second groups of solar cell strings. All of the solar cell strings may be connected to the bypass diode. The bypass diode may connect the first conductive element to the second conductive element.

The bypass diode may be connected in parallel with the solar cell strings. The bypass diode may have a first terminal connected to the positive terminals of one of the first and second groups of solar cell strings and a second terminal connected to the negative terminals of the other of the first and second groups of solar cell strings.

The bypass diode may be housed in a junction box. The junction box may be positioned on a rear side of the solar module, that is, a side of the solar module that is intended in use to face away from a radiation source (e.g. the sun).

The bypass diode may be configured to have a low resistance in one current flow direction and a high resistance in the opposite current flow direction. The bypass diode is connected such that in normal use (e.g. when no solar cells of a solar cell string are malfunctioning or shaded) the diode presents the high resistance to the normal direction of current flow. As such, current flows through the solar cell string rather than the diode. However, when a solar cell of the string malfunctions or is shaded, that cell presents a higher resistance to current flow compared to when it is not malfunctioning or shaded. If more than one solar cell in the string malfunctions or is shaded, then the resistance of these solar cells combines and adds up. When the solar cell resistance(s) of the string increases above the high resistance of the diode, current flows through the diode rather than the solar cell string, thereby encouraging current flow through other solar cell strings of the module. Essentially, current flows through the bypass diode when the path through the bypass diode is the path of least resistance (e.g. when one or more cells of a solar cell string are shaded or malfunctioning). When the bypass diode is not the path of least resistance (e.g. when no cells of the solar cell string are shaded or malfunctioning) then current flows through the solar cell string. Due to the provision of solar strings in parallel, the path of least resistance will at least partly depend on the pattern of shading across the solar module. That is, even if one solar cell string is heavily shaded (so as to present a high resistance), if other solar cell strings (in parallel) remain substantially unshaded, then current may pass through those solar cell strings instead of through the bypass diode.

In this way, the bypass diode enables electrical current to flow through the solar module so that electrical current generated by other interconnected solar modules can still be collected even though the solar module is not itself generating electrical current (e.g. due to shading or malfunctioning solar cells causing increased resistance).

The positive terminals of the first group of solar cell strings may be substantially aligned with the negative terminals of the second group of solar cell strings in a direction transverse to the solar cell strings. The negative terminals of the first group of solar cell strings may be substantially aligned with the positive terminals of the second group of solar cell strings in the transverse direction.

The solar module may comprise six solar cell strings. The first group may comprise three solar cell strings. The second group may comprise three solar cell strings. The first and second groups may comprise the same number of solar cell strings.

Each solar cell string comprises a plurality of solar cells. For example, each solar cell string may comprise between 10 and 30 solar cells, e.g. between 15 and 26 solar cells.

The plurality of solar cells of each solar cell string may partially overlap one another in a longitudinal direction of the solar cell string. That is, the plurality of solar cells may be arranged in a shingled manner. The solar cells of each string may be connected in series.

Each solar cell may be rectangular, having a greater length than width. Each solar cell may be oriented such that its width is aligned with the longitudinal direction of the solar cell string.

Each solar cell may be a half-cut solar cell (i.e. may be formed of a square solar cell that is divided (i.e. cut) into two parts). Thus, each solar cell may have a width that is twice as large as its length.

Each solar cell may be a triple-cut solar cell (i.e. formed of a square solar cell that is divided into three parts). Thus, each solar cell may have a width that is three times as large as its length. Each solar cell may otherwise be formed of a solar cell divided into four or five parts (so as to have a width four or five times as large as its length).

Cutting the solar cells (e.g. into halves, thirds, quarters, fifths) can reduce resistive losses. Resistive losses have a quadratic relationship with the area of each cell (and thus the length of each cell for a constant width). That is, resistive losses are proportional to the square of the area of the cells, and thus reducing the length can reduce resistance losses.

Cutting solar cells into e.g. halves, thirds, quarters, fifths, etc. means that more cells may be arranged within a module of a given size.

It will be appreciated that each solar cell may be configured to define any type of solar cell structure. For example, each solar cell may define a heterojunction (HJT) type solar cell. Alternatively, each solar cell may define a tandem junction solar cell. Similarly, any suitable means may be provided for electrically coupling the solar cells of a solar cell string to one another. In one example, the solar cells of each solar cell string may be connected to one another by way of a foil and wire arrangement, such as Smart Wire Connection Technology (SWCT®). That is, foil may be provided on front and back surfaces of each cell and wires may extend from the front surface of each cell (between the foil and the surface) to the back surface of an adjacent cell (so as to be between the back surface and the foil). In another example, the solar cells may be connected by one or more conducting elements such as a ribbon (e.g. a copper ribbon).

The skilled person will appreciate that except where mutually exclusive, a feature or parameter described in relation to any one of the above aspects may be applied to any other aspect. Furthermore, except where mutually exclusive, any feature or parameter described herein may be applied to any aspect and/or combined with any other feature or parameter described herein.

BRIEF DESCRIPTION OF THE DRAWINGS

Embodiments will now be described by way of example only, with reference to the figures, in which.

DETAILED DESCRIPTION

Aspects and embodiments of the present disclosure will now be discussed with reference to the accompanying figures. Further aspects and embodiments will be apparent to those skilled in the art. In the figures, the dimensions of elements maybe exaggerated for clarity. Also, the relative dimensions of elements shown in the figures is not necessarily representative of the actual relative thicknesses of the elements in all embodiments.

Figure 1:
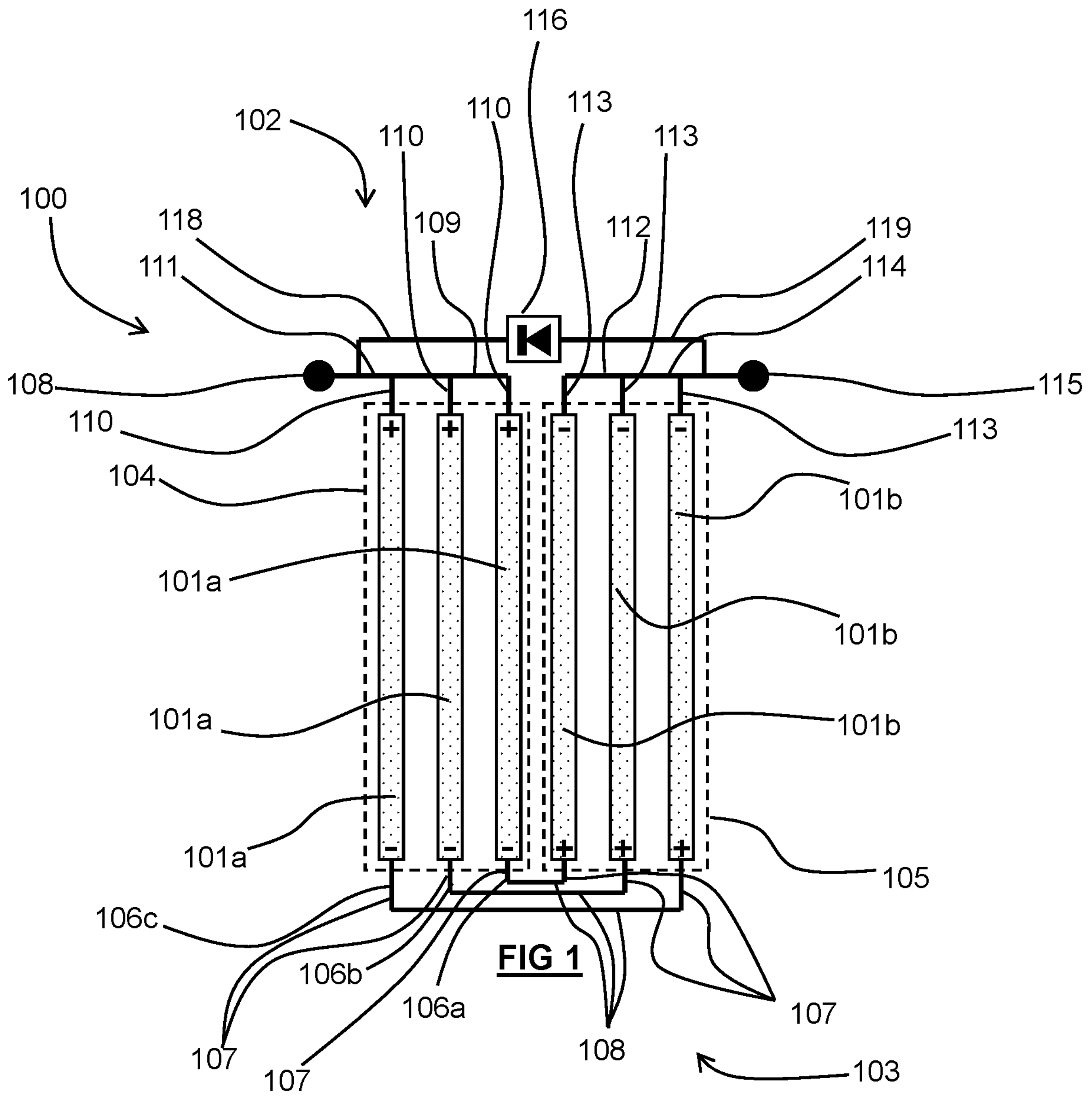
FIG. 1 is a schematic view of a solar module.

FIG. 1 depicts a solar module 100 comprising six solar cell strings 101*a*, 101*b* arranged side-by-side so as to be parallel and extending between first 102 and second 103 opposite ends of the solar module 100. Specifically, there are three solar cell strings 101*a* and three solar cell strings 101*b*. Although not apparent from the figure, each solar cell string 101*a*, 101*b* is formed of a plurality of solar cells connected in series. The solar cells may, in particular, be arranged so as to partially overlap in the longitudinal direction of the string (i.e. so as to be arranged in a shingled manner).

Each solar string 101*a*, 101*b* comprises positive and negative terminals (as depicted by the plus and minus symbols in the figure) at opposite ends of the solar string 101*a*, 101*b*. The solar cell strings 101*a*, 101*b* are arranged in a first group 104 of solar cell strings 101*a*, and a second group 105 of solar cell strings 101*b*. The solar cell strings 101*a* of the first group 104 may be different to the solar cell strings 101*b* of the second group 105 (e.g. different type, size, shape, etc.) or they may be the same. Each of the first 104 and second 105 groups comprises three solar cell strings 101*a*, 101*b*. As is apparent from the figure, the positive terminals of the solar strings 101*a* of the first group 104 are disposed towards the first end 102 of the solar module 100. Accordingly, the negative terminals of the solar strings 101*a* of the first group 104 are disposed towards the second end 103 of the solar module 100.

The solar cell strings 101*b* of the second group 105 have a reversed orientation to the solar cell strings 101*a* of the first group 104. Thus, each solar cell string 101*b* of the second group 105 has a negative terminal disposed towards first end 102 of the solar module 100 and a positive terminal disposed towards the second end 103 of the solar module 100.

The negative terminals of the solar cell strings 101*a* of the first group 104 are electrically connected to the positive terminals of the solar cell strings 101*b* of the second group 105. In particular, each solar cell string 101*a* of the first group 104 is connected in series with a single solar cell string 101*b* of the second group 105 to define a solar cell string pair. Each pair of solar cell strings 101*a*, 101*b* is connected by an intermediate conductive element in the form of an interconnection bus bar 106*a*, 106*b*, 106*c*. There are three pairs of solar cell strings 101*a*, 101*b*, and thus three corresponding intermediate interconnection bus bars 106*a*, 106*b*, 106*c*.

The first intermediate interconnection bus bar 106*a* connects the innermost pair of solar cell strings 101*a*, 101*b* (i.e. those closest to a vertical centreline of the solar module 100, as shown in FIG. 1). The second intermediate interconnection bus bar 106*b* connects the pair of solar cell strings 101*a*, 101*b* immediately outside of the innermost pair of solar cell strings 101*a*, 101*b*. The third intermediate interconnection bus bar 106*c* connects the outermost pair of solar cell strings 101*a*, 101*b*. In this way, the intermediate bus bars 106*a*, 106*b*, 106*c* are arranged concentrically, so as not to overlap. Each intermediate interconnection bus bar 106*a*, 106*b* 106*c* comprises a pair of legs 107 extending parallel with the solar cell strings 101*a*, 101*b*, and a crosslink 108 connecting the legs 107. Thus, the intermediate interconnection bus bars 106*a*, 106*b*, 106*c* are each substantially U-shaped. Also, for each of the intermediate interconnection bus bars 106*a*, 106*b*, 106*c* a length of the associated crosslink 108 may be greater than a length of each associated leg 107.

The solar module 100 further comprises a first conductive element in the form of a first interconnection bus bar 109, which comprises a plurality of legs 110 connected to the first group 104 of solar cell strings 101*a* and a crosslink 111 that extends transversely so as to connect the legs 110. The first interconnection bus bar 109 may connect the positive terminals of the solar cell strings 101_a_ of the first group 104 to a positive terminal connector 108 of the solar module 100. This positive terminal connector 108 may connect the solar module 100 to one or more external components such as a further solar module (not shown).

A second conductive element in the form of a second interconnection bus bar 112 is also provided, which comprises a plurality of legs 113 connected to the second group 105 of solar cell strings 101_b_, and a crosslink 114 that extends transversely so as to connect the legs 113. The second interconnection bus bar 112 may connect the negative terminals of the solar cell strings 101_b_ of the second group 105 to a negative terminal connector 115 of the solar module 100. This negative terminal connector 115 may also connect the solar module 100 to one or more external components such as a further solar module (not shown). In this way, each pair of connected solar cell strings 101_a_, 101_b_ is connected in parallel with the other pairs of solar cell strings 101_a_, 101_b_.

As should be apparent from FIG. 1, due to the arrangement of the solar cell strings 101_a_, 101_b_, the first 109 and second 112 interconnection bus bars do not overlap. This avoids the need to insulate the first and second interconnection bus bars 109, 112 from one another in overlap regions because no overlap regions exist. In turn, this reduces the cost and complexity of manufacturing the solar module 100 because insulators for overlap regions are not required.

A bypass diode 116 is connected between the first 109 and second 112 interconnection bus bars, so as to be connected in parallel with the solar cell strings 101_a_, 101_b_. The bypass diode 116 is configured to conduct when the solar cell strings 101_a_, 101_b_ are reverse biased (e.g. due to shading or malfunctioning solar cells). The bypass diode 116 is connected to the first 109 and second 112 interconnection bus bars via connectors 118 and 119, respectively.

Figure 2:
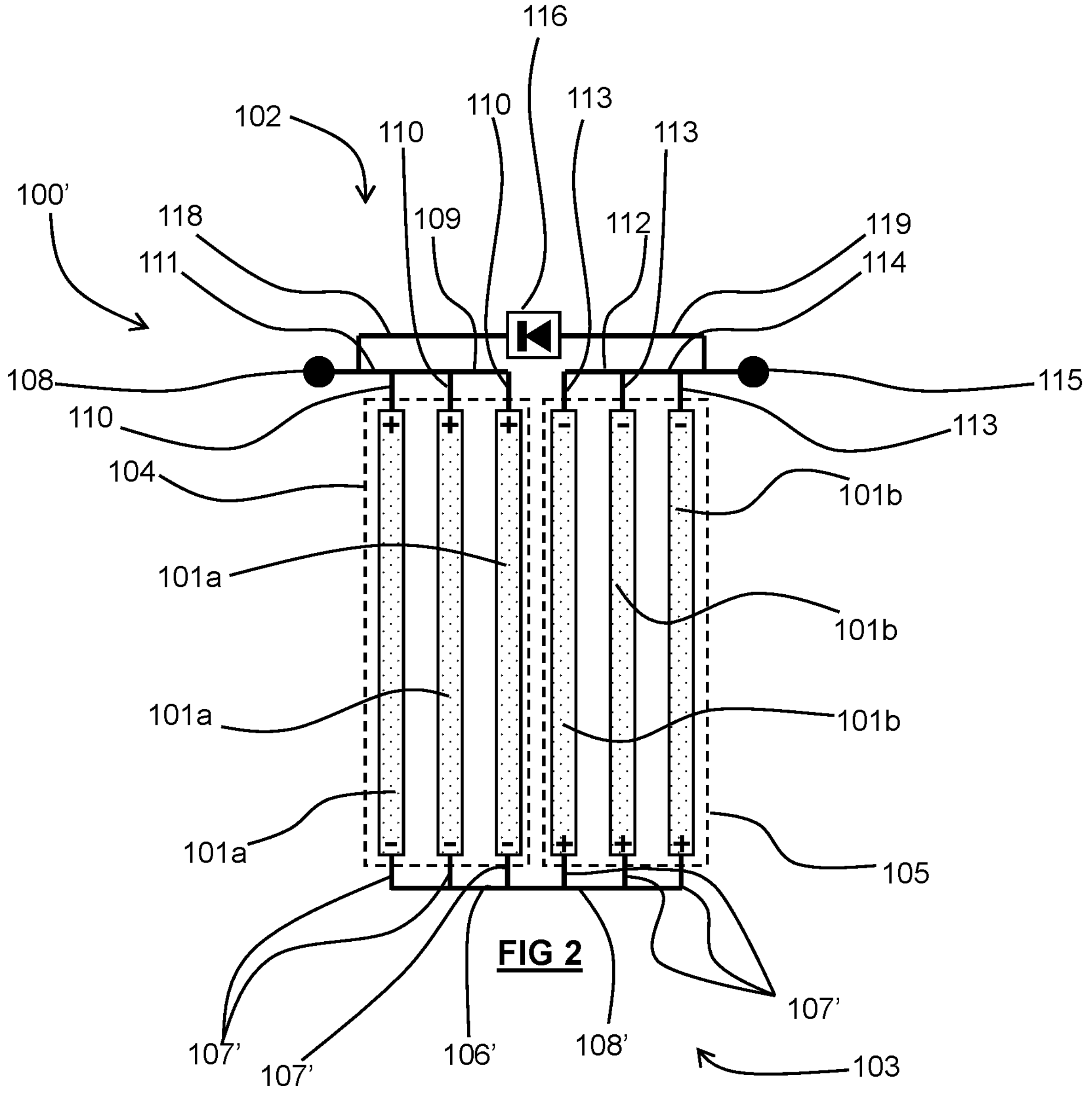
FIG. 2 is a schematic view of a variation of the solar module of FIG. 1.

The solar module 100' illustrated in FIG. 2 is a variation of that described above. As such, many of the features of this solar module 100' remain the same, and the same reference numerals have been used.

This variation solar module 100' differs only in that a single intermediate conductive element in the form of an intermediate interconnection bus bar 106' is provided (as opposed to a plurality of intermediate interconnection bus bars, as shown in FIG. 1). The intermediate interconnection bus bar 106' comprises a plurality of legs 107' and a single crosslink 108' connecting all of the legs 107'. This variation may permit the solar module 100' to be more compact than that of FIG. 1 (i.e. due to the need to space the U-shaped bus bars 106_a_, 106_b_ and 106_c_ of FIG. 1). This means that for a given solar module surface area, a higher percentage of that area can contain electricity generating solar cells in solar module 100' compared to solar module 100. In this way, the solar module 100' may generate more electricity than an equivalently sized solar module 100, meaning that the solar module 100' has a higher power and a higher efficiency compared to the solar module 100. Additionally, since the plurality of intermediate interconnection bus bars of solar module 100 are replaced by the single intermediate interconnection bus bar of solar module 100' the cost and complexity of manufacture is lower compared to that of solar module 100. Further, the solar module 100 and the solar module 100' only require a single bypass diode each.

It will be understood that the invention is not limited to the embodiments above-described and various modifications and improvements can be made without departing from the concepts described herein. Except where mutually exclusive, any of the features may be employed separately or in combination with any other features and the disclosure extends to and includes all combinations and sub-combinations of one or more features describes herein.

The invention claimed is:

1. A solar module comprising a plurality of solar cell strings arranged side-by-side, each solar cell string having positive and negative terminals at opposite ends thereof, the plurality of solar cell strings comprising:

a first group of adjacent solar cell strings, each oriented such that their positive terminals are disposed towards a first end of the solar module, wherein the first group of adjacent solar cell strings are next to one another without any other solar cell strings positioned therebetween; and a second group of adjacent solar cell strings, each oriented such that their positive terminals are disposed towards a second end of the solar module opposite the first end, the positive terminals of the second group of solar cell strings electrically connected to the negative terminals of the first group of solar cell strings, wherein the second group of adjacent solar cell strings are next to one another without any other solar cell strings positioned therebetween, wherein each solar cell string is connected in series with only one other solar cell string to define a solar cell string pair, each solar cell string pair comprising a solar cell string of the first group and a solar cell string of the second group.

2. A solar module according to claim 1 wherein each solar cell string pair is connected in parallel with the other solar cell string pairs.

3. A solar module according to claim 1 comprising one or more intermediate conductive elements connecting the positive terminals of the second group of solar cell strings to the negative terminals of the first group of solar cell strings.

4. A solar module according to claim 1 comprising a plurality of intermediate conductive elements, each intermediate conductive element connecting the positive terminal of the solar cell string of the second group in a solar string pair to the negative terminal of the solar cell string of the first group in the solar string pair.

5. A solar module according to claim 4 wherein each intermediate conductive element comprises:

a first leg connected to the negative terminal of the solar cell string of the first group;

a second leg connected to the positive terminal of the solar cell string of the second group; and a crosslink connecting the first and second legs.

6. A solar module according to claim 4 wherein the intermediate conductive elements are arranged concentrically.

7. A solar module according to claim 1 further comprising:

a first conductive element connected to the positive terminals of the first group of solar cell strings; and a second conductive element connected to the negative terminals of the second group of solar cell strings.

8. A solar module according to claim 1 comprising a bypass diode connected in parallel with the solar cell strings.

9. A solar module according to claim 8, further comprising:

a first conductive element connected to the positive terminals of the first group of solar cell strings;

a second conductive element connected to the negative terminals of the second group of solar cell strings; and wherein the bypass diode is connected between the first and second conductive elements.

10. A solar module according to claim 1 wherein each solar cell string comprises a plurality of solar cells overlapping in a longitudinal direction of the solar cell string.

11. A solar module according to claim 10 wherein each solar cell is rectangular, having a greater width than length.

12. A solar cell module according to claim 1 wherein the positive terminals of the first group of adjacent solar cell strings are closer to the first end than the positive terminals of the second group of adjacent solar cell strings; and wherein the positive terminals of the second group of adjacent solar cell strings are closer to the second end than the positive terminals of the first group of adjacent solar cell strings.

13. A solar cell module according to claim 1 wherein the first group of adjacent solar cell strings are side-by-side; and wherein the second group of adjacent solar cells are side-by-side.

14. A solar module according to claim 1 wherein each solar cell string of the first group of adjacent solar cell strings and the second group of adjacent solar cell strings span a majority of a major dimension of the solar module.

15. A solar module according to claim 1 further comprising a first interconnection busbar for connection to a positive terminal connector and a second interconnection busbar for connection to a negative terminal connector, wherein each solar cell string pair is connected between the first interconnection busbar and the second interconnection busbar.

* * * * *